(12) United States Patent
Andry et al.

(10) Patent No.: US 8,388,782 B2
(45) Date of Patent: Mar. 5, 2013

(54) HANDLER ATTACHMENT FOR INTEGRATED CIRCUIT FABRICATION

(75) Inventors: Paul S. Andry, Yorktown Heights, NY (US); Bing Dang, Chappaqua, NY (US); John Knickerbocker, Yorktown Heights, NY (US); Aparna Prahbakar, North White Plains, NY (US); Peter J. Sorce, Poughkeepsie, NY (US); Robert E. Trzcinski, Rhinebeck, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/788,832

(22) Filed: May 27, 2010

(65) Prior Publication Data

US 2011/0290402 A1    Dec. 1, 2011

(51) Int. Cl.
*B32B 38/10* (2006.01)
*B32B 37/12* (2006.01)
(52) U.S. Cl. .......... 156/64; 156/247; 156/712; 156/930; 438/14

(58) Field of Classification Search ................... 156/712, 156/753, 930, 64, 247
See application file for complete search history.

(56) References Cited

U.S. PATENT DOCUMENTS

| 2009/0221217 A1 | 9/2009 | Gajaria et al. |
| 2009/0311849 A1 | 12/2009 | Andry et al. |
| 2010/0038127 A1 | 2/2010 | Brist et al. |

OTHER PUBLICATIONS

Andry et al., Method of Separating Integrated Circuit Chips Fabricated on a Wafer, filed Jun. 17, 2008, U.S. Appl. No. 12/140,492, IBM Corporation.

*Primary Examiner* — Mark A Osele
(74) *Attorney, Agent, or Firm* — Cantor Colburn LLP; Louis Percello

(57) ABSTRACT

A method for attaching a handler to a wafer, the wafer comprising an integrated circuit (IC), includes forming a layer of an adhesive on the wafer, the adhesive comprising a polyimide-based polymer configured to withstand processing at a temperature of over about 280° C.; and adhering a handler to the wafer using the layer of adhesive. A system for attaching a handler to a wafer, the wafer comprising IC, includes a layer of an adhesive located on the wafer, the adhesive comprising a polyimide-based polymer configured to withstand processing at a temperature of over about 280° C.; and a handler adhered to the wafer using the layer of adhesive.

10 Claims, 5 Drawing Sheets

100

ATTACH HANDLER TO WAFER USING ADHESIVE; PROCESS WAFER
101

ABLATE ADHESIVE USING LASER
102

RELEASE HANDLER
103

REMOVE ANY REMAINING ADHESIVE FROM WAFER
104

500

WAFER 203

FIG. 5

HANDLER ATTACHMENT FOR INTEGRATED CIRCUIT FABRICATION

CROSS-REFERENCE TO RELATED APPLICATION

This application is related to application Ser. Nos. 12/788,839 and 12/788,843, each assigned to International Business Machines Corporation (IBM) and filed on the same day as the instant application, all of which are herein incorporated by reference in their entirety.

FIELD

This disclosure relates generally to the field of integrated circuit fabrication.

DESCRIPTION OF RELATED ART

Multiple integrated circuit (IC) products, which may be referred to as chips or dies, may be formed on a larger semiconductor substrate, referred to as a wafer. The IC fabrication process may comprise fabrication of multiple complementary metal-oxide-semiconductor (CMOS) devices on the wafer. If the wafer is relatively thin, an adhesive may be used to attach the wafer to a rigid handler, so that the handler may provide mechanical support for the wafer during the CMOS fabrication processes. However, the CMOS fabrication process may include chemical processing and/or high temperature processing, which may reach temperatures up to 400° C., which may cause the adhesive to break down.

SUMMARY

In one aspect, a method for attaching a handler to a wafer, the wafer comprising an integrated circuit (IC), includes forming a layer of an adhesive on the wafer, the adhesive comprising a polyimide-based polymer configured to withstand processing at a temperature of over about 280° C.; and adhering a handler to the wafer using the layer of adhesive.

In one aspect, a system for attaching a handler to a wafer, the wafer comprising IC, includes a layer of an adhesive located on the wafer, the adhesive comprising a polyimide-based polymer configured to withstand processing at a temperature of over about 280° C.; and a handler adhered to the wafer using the layer of adhesive.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 5 illustrates an embodiment of the device of FIG. 4 after cleanup of the adhesive from the wafer.

DETAILED DESCRIPTION

Embodiments of systems and methods for handler attachment for IC fabrication are provided, with exemplary embodiments being discussed below in detail. The handler material and adhesive may be selected such that the handler remains attached to the wafer during the CMOS fabrication process. The handler may then be released from the wafer after the fabrication process is completed using a laser ablation, or may remain attached to the wafer in operation. The laser may have a specified wavelength that may be selected based on the handler material. Attachment and release may be performed without contamination of or damage to the wafer. The adhesive may comprise a polymer, including but not limited to a thermoset polymer and/or a polyimide-based polymer, that may withstand temperatures up to about 400° C. and any chemical process that may occur during the CMOS fabrication process. The attachment and release process may be relatively fast, allowing good throughput for the overall IC fabrication process.

Figure 1:
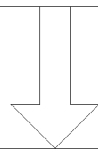
FIG. 1 illustrates an embodiment of a method for handler attachment and release.
Figure 1:
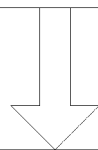
Figure 1:
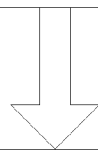
Figure 2:
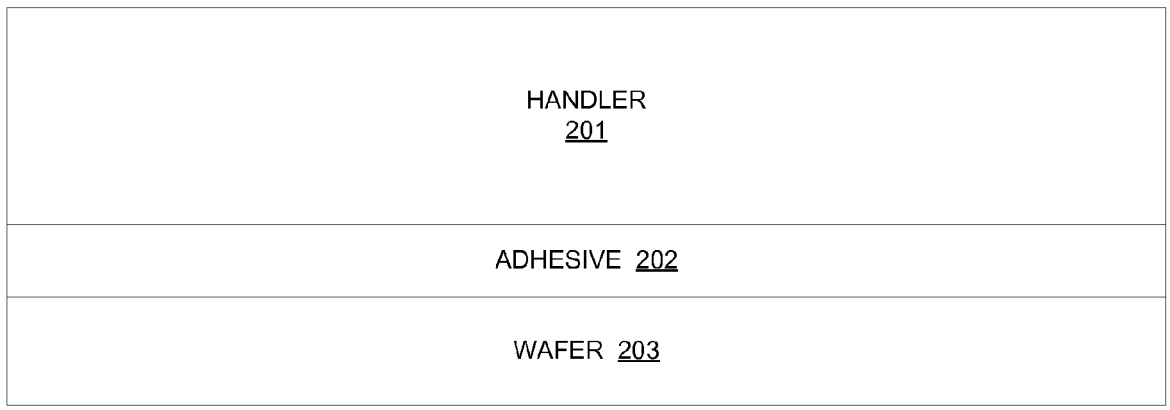
FIG. 2 illustrates an embodiment of a wafer attached to a handler using an adhesive.

FIG. 1 illustrates an embodiment of a method for handler attachment and release. FIG. 1 is discussed with reference to FIGS. 2-5. In block 101, a handler 201 is attached to a wafer 203 using an adhesive 202. In block 101, a handler 201 is attached to a wafer 203 using an adhesive 202, as shown in FIG. 2. The wafer may comprise a thinned substrate, and may be between about 500 and 1000 microns (μm) thick in some embodiments. The adhesive 202 may comprise a polymer, including but not limited to a thermoset polymer and/or a polyimide-based polymer, which may withstand high-temperature processing at over 280° C. in some embodiments, and in the range of 350° C. to 400° C. in some preferred embodiments.

After attachment of handler 201, processing, which may include CMOS fabrication processing, may be performed on wafer 203. The processed wafer 203 may comprise any appropriate CMOS devices, including silicon-based 3D or 4D IC chips, and may comprise electrical contacts and vias in some embodiments. The wafer 203 may comprise including but not limited to a thin film solar cell, a solar cell comprising a copper-indium-gallanide-selenium (CIGS) based thin film, a silicon solar cell, or a glass substrate based solar cell.

Handler 201 provides mechanical support to wafer 203 during CMOS processing, and may remain permanently attached to wafer 203 using adhesive 202 in embodiments comprising a wafer 203 that requires mechanical support in operation, such as a thin film solar cell. Handler 201 may comprise a relatively rigid material that is transparent in the range of about 193 nanometers (nm) to about 400 nm, and preferably in the range of 248 nm to 351 nm, including but not limited to quartz, glass, diamond, or sapphire. Handler 201 may be selected such that the coefficient of thermal expansion (CTE) of handler 201 is closely matched to the CTE of the material comprising wafer 203. Handler 201 may comprise electrical vias with connections that mate to any electrical contacts on wafer 203, allowing device 200 comprising handler 201 to be used in a test apparatus before release of handler 201 (described below with respect to blocks 102-104), or in operation if handler 201 is not released from wafer 203. A handler 201 that does not comprise electrical vias may be used in operation in conjunction with a wafer 203 that comprises a solar cell, including but not limited to a thin film solar cell, a solar cell comprising a copper-indium-gallanide-selenium (CIGS) based thin film, a silicon solar cell, or a glass substrate based solar cell.

Figure 3:
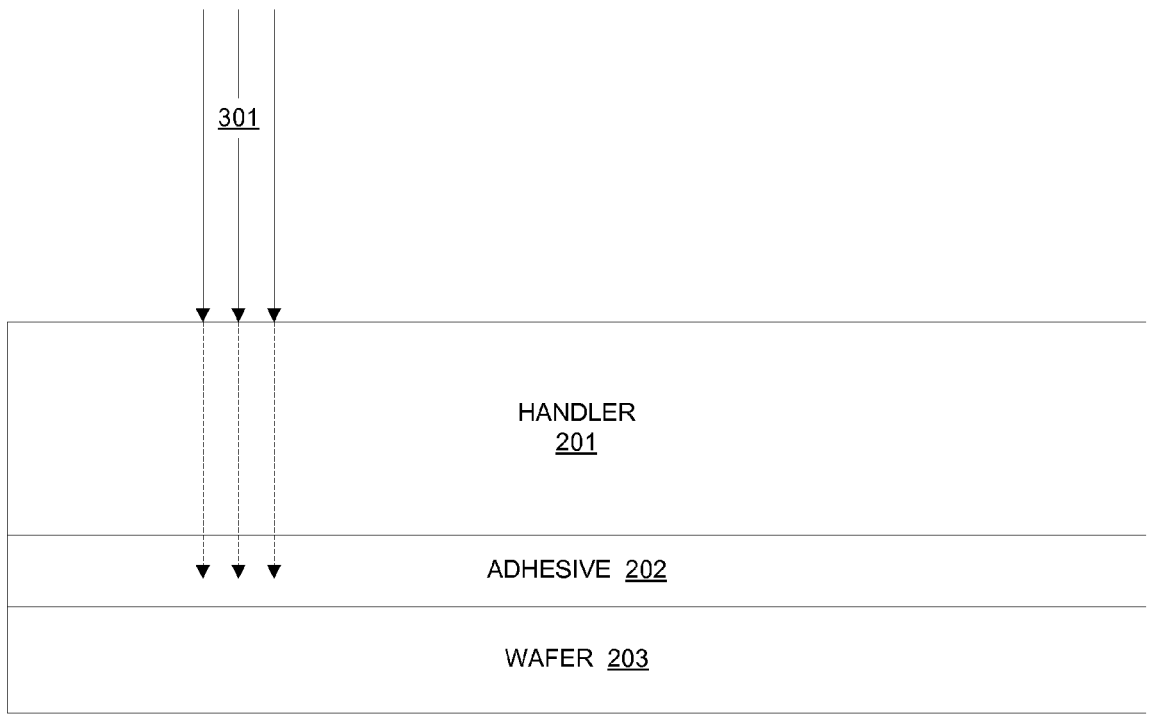
FIG. 3 illustrates an embodiment of the device of FIG. 2 during laser ablation.
Figure 4:
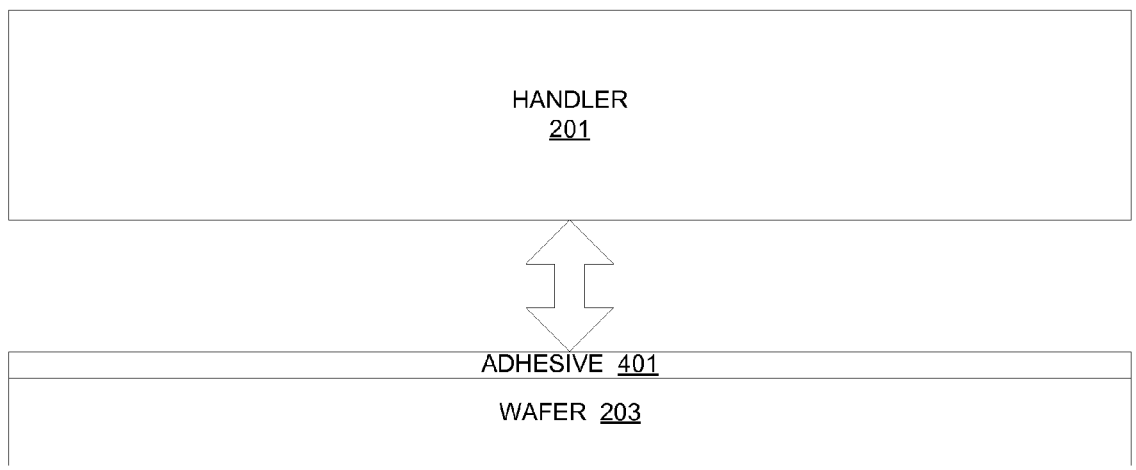
FIG. 4 illustrates an embodiment of the device of FIG. 3 after release of the handler from the wafer.

In embodiments in which handler 201 is released from wafer 203, after any CMOS processing steps in which the mechanical support provided by handler 201 to wafer 203 is required are completed, flow proceeds to blocks 102-104. In block 102, as shown in FIG. 3, the adhesive 202 is ablated by a laser 301, which may comprise ultraviolet (UV) light having a wavelength between about 193 nm to about 400 nm in some embodiments, and between about 248 nm to 351 nm in some preferred embodiments. In embodiments in which handler 201 comprises quartz, laser 301 may have a wavelength of about 193 nm. Energy from laser 301 passes through handler 201 and is absorbed by adhesive 202, causing the adhesive 202 to carbonize or vaporize, allowing release of handler 201. Depending on the laser wavelength and the handler material, the transmission of the energy from the laser through handler 201 may be greater than 80%, and the light absorption depth in the adhesive 202 may be less than 1 µm. In block 103, as shown in FIG. 4, the handler 201 is released from wafer 203. Release of handler 201 may result in a portion of ablated adhesive 401 remaining on wafer 203 in some embodiments. In block 104, the remaining ablated adhesive 401 is removed, using, for example, a wet soak, resulting in wafer 203.

The technical effects and benefits of exemplary embodiments include attachment of a handler to an IC wafer that may withstand chemical and relatively high temperature CMOS processing.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for attaching a handler to a wafer, the wafer comprising an integrated circuit (IC), the method comprising:
   forming a layer of an adhesive on the wafer, the adhesive comprising a polyimide-based polymer configured to withstand processing at a temperature of over about 280° C.; and
   adhering a handler, wherein the handler comprises a test apparatus comprising electrical vias with connections configured to mate to the electrical contacts on the wafer, to the wafer using the layer of adhesive;
   testing the wafer using the handler that is adhered to the wafer by the layer of adhesive;
   after testing the wafer using the handler, ablating the adhesive through the handler using a laser, wherein a wavelength of the laser is selected based on a transparency of the handler material; and
   separating the handler from the wafer after ablating the adhesive.

2. The method of claim 1, wherein the adhesive is configured to withstand processing at a temperature of over about 350° C.

3. The method of claim 1, wherein the wafer comprises a silicon-based 3D or 4D chip comprising electrical contacts.

4. The method of claim 1, wherein the wafer comprises one of a thin film solar cell, a silicon solar cell, and a glass substrate-based solar cell.

5. The method of claim 4, wherein the handler material is transparent in a wavelength range of about 248 nm to about 351 nm.

6. The method of claim 1, wherein the handler comprises a material that is transparent in a wavelength range of about 193 nanometers (nm) to about 400 nm.

7. The method of claim 1, wherein the handler material comprises one of quartz, glass, diamond, and sapphire.

8. The method of claim 1, wherein the handler comprises a material having a coefficient of thermal expansion (CTE), and wherein the handler material is selected such that the CTE of the handler material is closely matched to a CTE of the wafer.

9. The method of claim 1, wherein the wafer has a thickness between about 500 microns and about 1000 microns.

10. The method of claim 1, wherein the handler material comprises quartz, and the wavelength of the laser is about 193 nm.

* * * * *